(12) United States Patent
Jang

(10) Patent No.: US 7,750,430 B2
(45) Date of Patent: Jul. 6, 2010

(54) SEMICONDUCTOR DEVICE AND METHOD FOR FABRICATING THE SAME

(75) Inventor: Tae Su Jang, Gwacheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 223 days.

(21) Appl. No.: 11/966,424

(22) Filed: Dec. 28, 2007

(65) Prior Publication Data
US 2009/0108394 A1 Apr. 30, 2009

(30) Foreign Application Priority Data
Oct. 31, 2007 (KR) .................. 10-2007-0110695

(51) Int. Cl.
*H01L 29/00* (2006.01)
*H01L 21/8234* (2006.01)
(52) U.S. Cl. .............. 257/506; 257/E29.001; 257/E21.001; 438/237
(58) Field of Classification Search ........... 257/506, 257/E29.001, E21.546; 438/237
See application file for complete search history.

(56) References Cited

U.S. PATENT DOCUMENTS
2004/0124464 A1* 7/2004 Narazaki .................. 257/339

FOREIGN PATENT DOCUMENTS
KR 1020030027723 A 4/2003

\* cited by examiner

*Primary Examiner*—David S Blum
(74) *Attorney, Agent, or Firm*—Townsend and Townsend and Crew LLP

(57) ABSTRACT

A method for fabricating a semiconductor device comprises forming a deposition structure including a first substrate, an insulating layer and a second substrate of a SOI substrate; etching the second substrate located in a boundary of cell and core regions and a peripheral region to form a line-type trench; filling an isolating film in the trench; removing the second substrate and the insulating layer of the peripheral region; performing a selective epitaxial growth (SEG) process using the first substrate exposed in the peripheral region to form an epitaxial layer; and performing a chemical mechanical polishing (CMP) process on the epitaxial layer. As a result, the method has a floating body effect to shorten a developing period and improve a process yield.

5 Claims, 6 Drawing Sheets

SEMICONDUCTOR DEVICE AND METHOD FOR FABRICATING THE SAME

CROSS-REFERENCES TO RELATED APPLICATIONS

The priority of Korean patent application number 10-2007-0110695, filed on Oct. 31, 2007, which is incorporated by reference in its entirety, is claimed.

BACKGROUND OF THE INVENTION

The present invention relates to a semiconductor device, and more specifically, to a semiconductor device comprising of a Silicon-On-Insulator (SOI) substrate having cell/core regions and a peripheral region, which is formed to have the same structure as that of a conventional substrate to obtain a floating body effect.

A DRAM for performing a general storage process is manufactured with a bulk silicon substrate. A semiconductor device for performing a storage process has a cell structure including a transistor and a capacitor.

Due to high integration of semiconductor devices, the cell structure has become complicated, and it is difficult to secure electric characteristics of the transistor and the capacitor. As a result, a semiconductor device comprising a SOI substrate has been developed. A top silicon substrate of the SOI substrate is isolated from a bottom silicon substrate by an insulating layer so that the transistor form the top silicon substrate can obtain a floating body effect.

If electrons passing through a channel of the transistor increases, a current flowing is increased and a drain voltage is also increased. When the drain voltage is larger, collision of silicon molecules is increased in the drain region to increase silicon electrons and holes. In the case of a general bulk substrate, the holes are passed through a ground to increase a threshold voltage of the transistor. In the case of a SOI substrate, holes are accumulated in the top silicon substrate to obtain a floating body effect for generating a voltage. As a result, it is easy to regulate a voltage of the body, thereby improving an electric characteristic of the transistor. The semiconductor device can serve as a memory device without a capacitor.

A SOI substrate is used for a DRAM cell. In this case, a model parameter, which has been developed in a conventional DRAM technology, is changed to develop a new circumstance. As a result, the floating body effect is not required. Moreover, a developing period for the model parameter of the peripheral region where various circuits are irregularly formed would be increased which would also increase the cost.

BRIEF SUMMARY OF THE INVENTION

Various embodiments of the present invention are directed at providing a semiconductor device comprising a first substrate, an insulating layer and a second substrate. A region where a peripheral circuit is formed is isolated from a region where cell/core circuits are formed. The second substrate and the insulating layer of the peripheral region are removed, and an epitaxial layer is formed so that the semiconductor substrate of the peripheral region may have a similar circumstance as that of a bulk silicon substrate. The cell/core regions are advantageous to the floating body effect, thereby shortening the developing period for forming a semiconductor device and improving a process yield of the semiconductor device.

According to an embodiment of the present invention, a semiconductor device comprises a first substrate disposed in a cell region, a core region and a peripheral region, an insulating layer and a second substrate sequentially deposited over the first substrate of the cell region and the core region, an epitaxial layer formed over the first substrate of the peripheral region to the height of the second substrate, and an isolating film formed in a boundary of the peripheral region and the cell and core regions to isolate the epitaxial layer from the insulating layer and the second substrate.

According to an embodiment of the present invention, a method for fabricating a semiconductor device comprises: forming a deposition structure including a first substrate, an insulating layer and a second substrate of a SOI substrate; etching the second substrate located in a boundary of cell and core regions and a peripheral region to form a line-type trench; filling an isolating film in the trench; removing the second substrate and the insulating layer of the peripheral region; performing a selective epitaxial growth (SEG) process using the first substrate exposed in the peripheral region to form an epitaxial layer; and performing a chemical mechanical polishing (CMP) process on the epitaxial layer.

DESCRIPTION OF EMBODIMENTS

In order to obtain a floating body cell (FBC), a body which is a semiconductor substrate where a cell transistor is formed is isolated (i.e., floating). A memory device of a semiconductor device using the FBC does not require a storage capacitor. In comparison with a conventional memory device, it is necessary to secure cell capacitance. In the embodiment of the present invention, a silicon-on-insulator (SOI) substrate is used.

Figure 1:
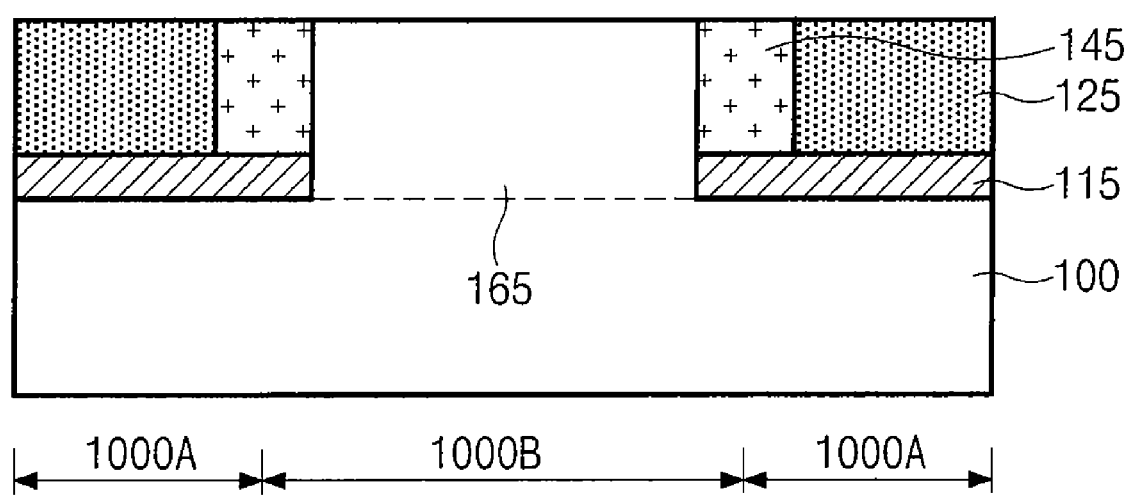
FIG. 1 is a cross-sectional diagram illustrating a semiconductor device according to an embodiment of the present invention.

FIG. 1 is a cross-sectional diagram illustrating a semiconductor device according to an embodiment of the present invention.

Referring to FIG. 1, a first substrate 100 defines a cell/core region 1000A and a peripheral region 1000B.

An insulating layer 115 and a second substrate 125 are sequentially deposited over the first substrate 100 of the cell/core region 1000A. The first substrate 100 or the second substrate 125 includes an n-type or p-type silicon substrate. The insulating layer 115 includes an oxide film.

An expitaxial layer 165 is formed over the first substrate 100 of the peripheral region 1000B to the height of the second substrate 125. An isolating film 145 is formed between the second substrate 125 and the epitaxial layer 165, which is a boundary of the cell/core region 1000A and the peripheral region 1000B. The epitaxial layer 165 is grown with the same type as that of the first substrate 100 and with an undoped type. The isolating film 145 includes a high density plasma (HDP), chemical vapor deposition (CVD) or spin-on dielectric (SOD) oxide film formed by a Shallow Trench Isolation (STI) process.

As a result, a SOI substrate structure where a FBC can be formed is disposed in the cell/core region 1000A, and a bulk silicon substrate is located in the peripheral region 1000B.

FIGS. 2a to 2j are cross-sectional diagrams illustrating a method for fabricating a semiconductor device according to an embodiment of the present invention.

Figure 2A:
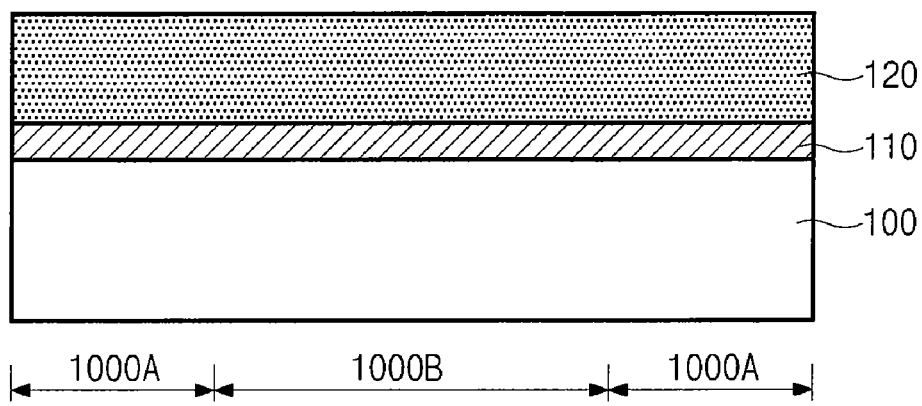
FIGS. 2a to 2j are cross-sectional diagrams illustrating a method for fabricating a semiconductor device according to an embodiment of the present invention.

Referring to FIG. 2a, a first substrate 100, an insulating layer 110 and a second substrate 120 are sequentially deposited to obtain a FBC in the cell/core region 1000A. The first and second substrates 100 and 120 are ion-implanted with n-type or p-type impurities. The insulating layer 100 includes an oxide film.

When a FBC is located in the peripheral region 1000B, a design burden is increased in the second substrate 120. As a result, a process for isolating the peripheral region 1000B is performed to reduce the design burden.

Figure 2B:
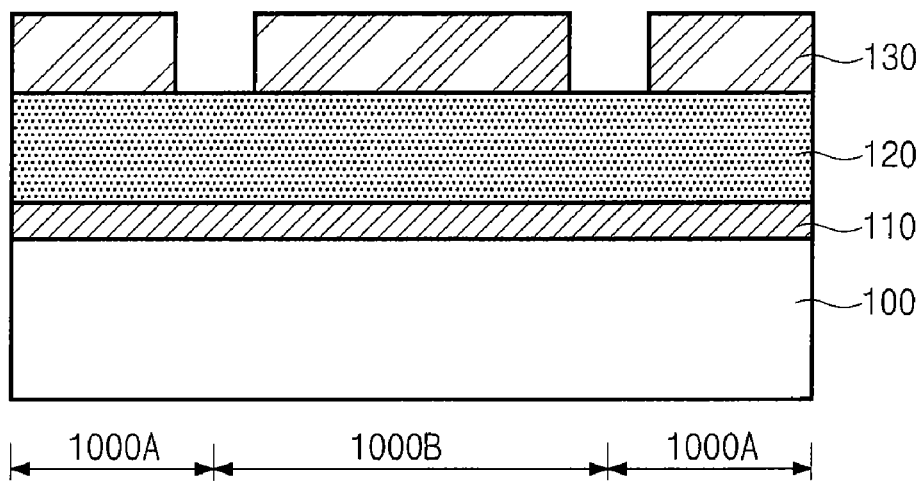

Referring to FIG. 2b, a first mask pattern 130 to expose a boundary of the cell/core region 1000A and the peripheral region 1000B is formed over the second substrate 120. The first mask pattern 130 includes a photoresist film, a nitride film and a carbon layer which have an etch selectivity of silicon and oxide films.

Figure 2C:
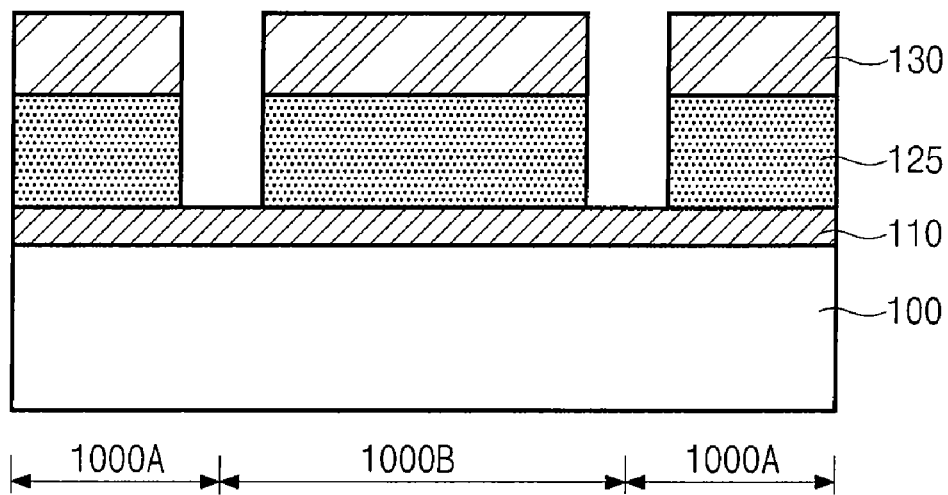

Referring to FIG. 2c, the second substrate 120 is etched with the first mask pattern 130 as an etching mask to form a second substrate pattern 125 that exposes the insulating layer 110. The second substrate pattern 125 includes a device isolating trench, which is called a STI process.

Figure 2D:
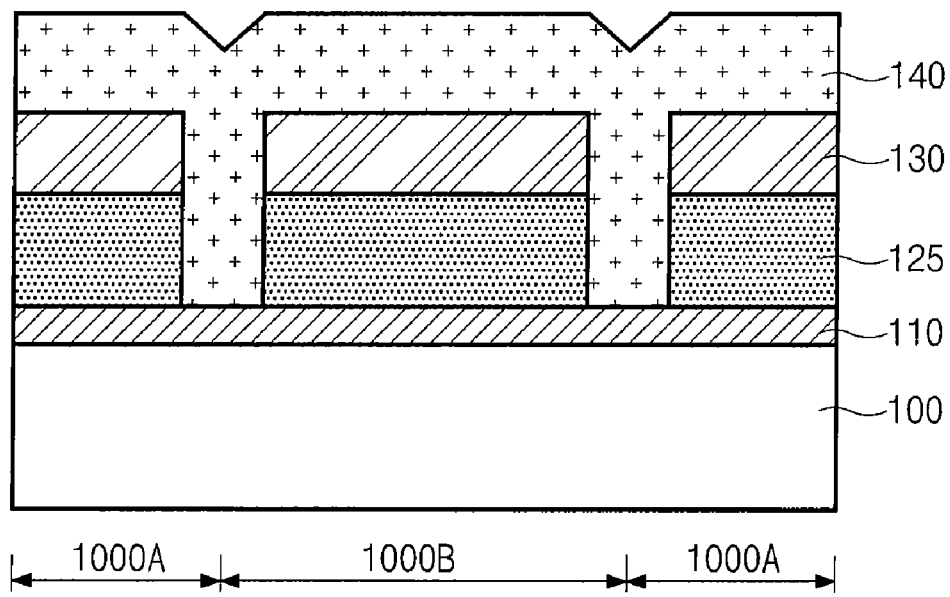

Referring to FIG. 2d, a device isolating insulating layer 140 is formed to fill a region between the second substrate patterns 125. The device isolating insulating layer 140 includes a high density plasma (HDP), chemical vapor deposition (CVD) or spin-on dielectric (SOD) oxide film.

Figure 2E:
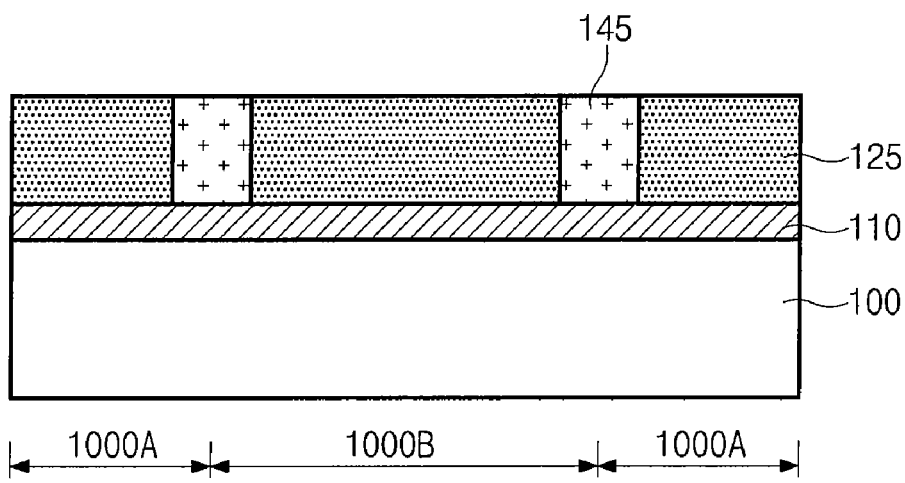

Referring to FIG. 2e, a CMP process is performed to remove the first mask pattern 130 and to isolate the device isolating insulating layer 140. An isolating film 145 is formed to isolate the cell/core region 1000A from the peripheral region 1000B.

Figure 2F:
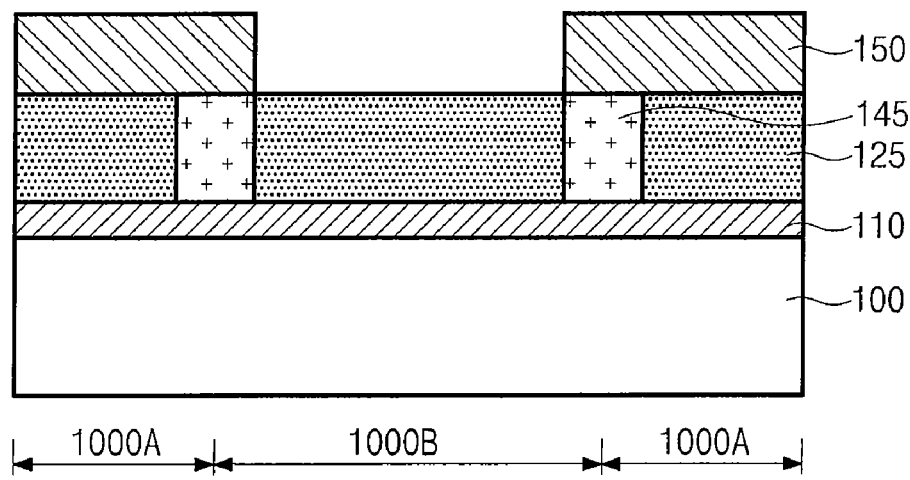

Referring to FIG. 2f, a second mask pattern 150 that exposes the peripheral region 1000B is formed over the second substrate pattern 125 and the isolating film 145. The second mask pattern 150 includes a photoresist film, a nitride film and a carbon layer which have an etch selectivity of silicon and oxide films.

Figure 2G:
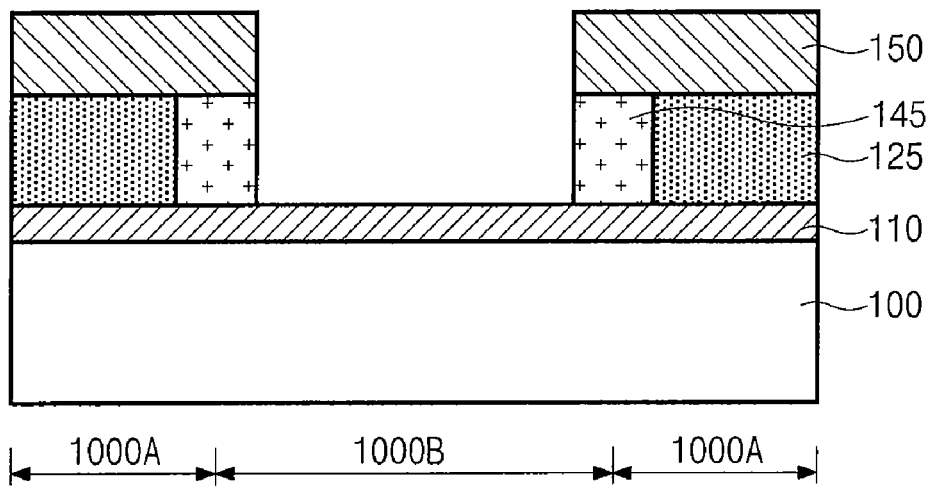

Referring to FIG. 2g, the second substrate pattern 125 is etched with the second mask pattern 150 as an etching mask.

Figure 2H:
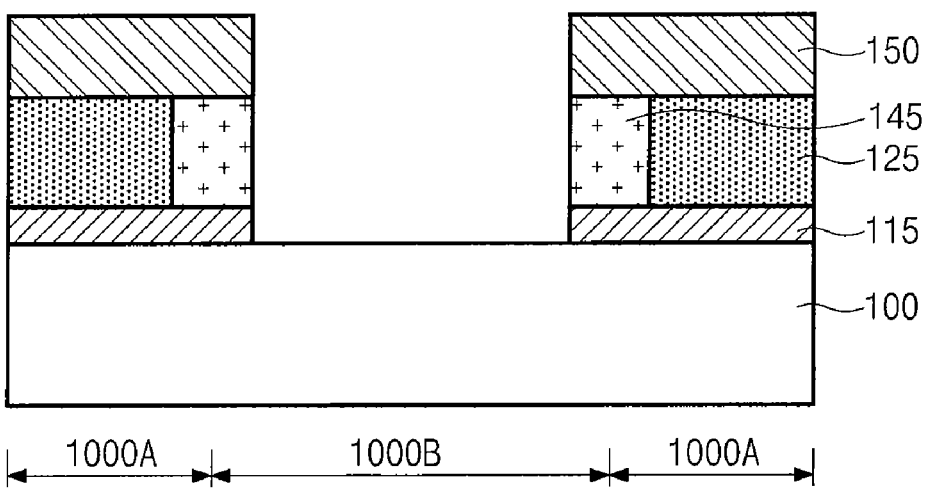

Referring to FIG. 2h, an insulating layer 110 exposed by the second mask pattern 150 is formed to obtain an insulating pattern 115 that exposes the first substrate 100 of the peripheral region 1000B.

Figure 2I:
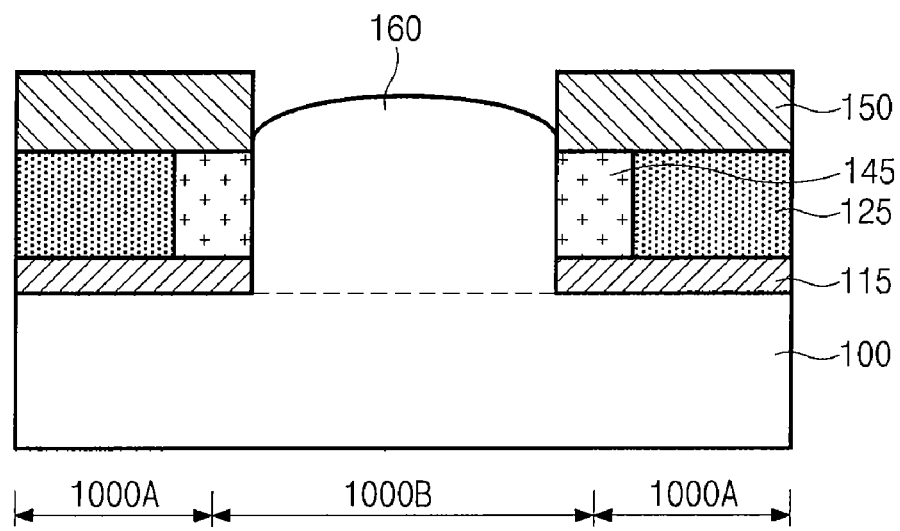

Referring to FIG. 2i, a SEG process is performed with the first substrate 100 as a seed to form an epitaxial growth layer 160. The n-type or p-type impurities implanted into the first substrate 100 are not implanted into the epitaxial growth layer 160.

Figure 2J:
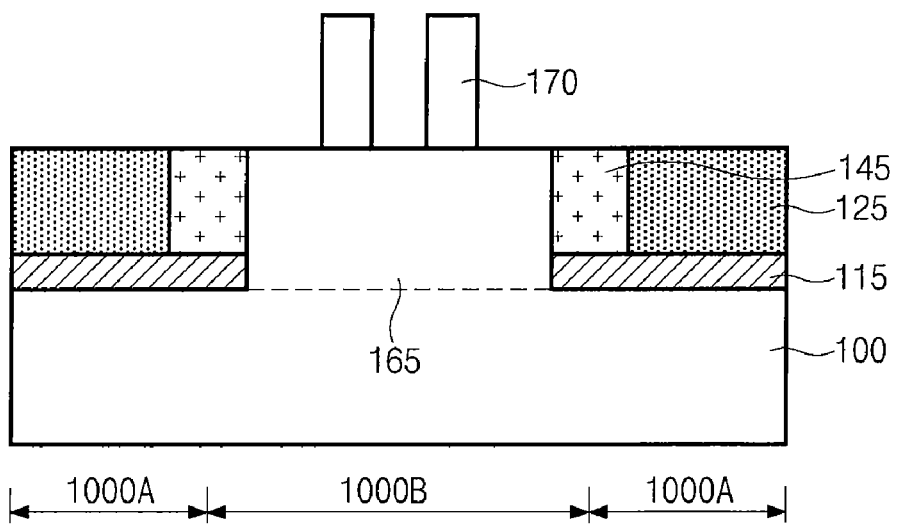

Referring to FIG. 2j, a CMP process is performed to remove the second mask pattern 150 and planarize the epitaxial growth layer 160.

A gate 170 is formed in the peripheral region 1000B. The peripheral region 1000B has the same state as that of a general semiconductor substrate. As a result, the same design pattern of the prior art can be applied to the gate 170 of the peripheral region 1000B, thereby shortening a design change period.

As described above, according to an embodiment of the present invention, a semiconductor substrate has a deposition structure including a first substrate, an insulating layer and a second substrate in order to obtain a FBC without a storage capacitor. However, a new process performed on a peripheral region, which does not require a floating body effect, causes an unnecessary developing period. A cell/core region has a deposition structure including the first substrate, the insulating layer and the second substrate, and a peripheral region includes a bulk type semiconductor substrate. A STI process is performed on a boundary of the cell/core region and the peripheral region to form an isolating film and an epitaxial growth layer in the peripheral region. As a result, a design pattern for the peripheral region is not required but the process yield and reliability of the semiconductor device can be improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first substrate defining a cell region, a core region and a peripheral region;
   an insulating layer and a second substrate sequentially provided over the first substrate of the cell region and the core region;
   an epitaxial layer formed over the first substrate of the peripheral region to the height of the second substrate; and
   an isolating film formed in a boundary of the peripheral region and the cell and core regions to isolate the epitaxial layer from the insulating layer and the second substrate.

2. The semiconductor device according to claim 1, wherein the first substrate includes an n-type or p-type silicon substrate, and the second substrate includes an n-type or p-type silicon substrate.

3. The semiconductor device according to claim 1, wherein the insulating layer includes an oxide film.

4. The semiconductor device according to claim 1, wherein the epitaxial layer is grown without being doped.

5. The semiconductor device according to claim 1, wherein the isolating film includes a high density plasma (HDP), chemical vapor deposition (CVD) or spin-on dielectric (SOD) oxide film.

* * * * *